(12) United States Patent
Taga et al.

(10) Patent No.: US 12,377,509 B2
(45) Date of Patent: Aug. 5, 2025

(54) MANUFACTURING METHOD FOR A SUBSTRATE WAFER

(71) Applicant: SHIN-ETSU HANDOTAI CO., LTD., Tokyo (JP)

(72) Inventors: Ryo Taga, Nishigo-mura (JP); Yuki Tanaka, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 180 days.

(21) Appl. No.: 17/921,805

(22) PCT Filed: Mar. 17, 2021

(86) PCT No.: PCT/JP2021/010731
§ 371 (c)(1),
(2) Date: Oct. 27, 2022

(87) PCT Pub. No.: WO2021/235067
PCT Pub. Date: Nov. 25, 2021

(65) Prior Publication Data
US 2023/0173633 A1 Jun. 8, 2023

(30) Foreign Application Priority Data

May 21, 2020 (JP) .................................. 2020-88949

(51) Int. Cl.
| | | |
|---|---|---|
| *B24B 1/00* | (2006.01) | |
| *B24B 7/02* | (2006.01) | |
| *B24B 7/22* | (2006.01) | |
| *H01L 21/02* | (2006.01) | |
| *B29C 59/02* | (2006.01) | |

(52) U.S. Cl.
CPC .............. *B24B 7/02* (2013.01); *B24B 7/228* (2013.01); *H01L 21/02013* (2013.01); *H01L 21/02024* (2013.01); *B29C 2059/027* (2013.01)

(58) Field of Classification Search
CPC B24B 1/00; B24B 7/228; B24B 41/06; B29C 2059/027; H01L 21/02013; H01L 21/02024
USPC .............................. 264/162; 438/759; 451/57
See application file for complete search history.

(56) References Cited

U.S. PATENT DOCUMENTS

| | | |
|---|---|---|
| 2008/0132032 A1 | 6/2008 | Tomita et al. |
| 2010/0032806 A1 | 2/2010 | Kihara et al. |
| 2015/0004799 A1 | 1/2015 | Tanaka et al. |
| 2017/0345694 A1 | 11/2017 | Hayashi et al. |
| 2019/0333775 A1 | 10/2019 | Nishitani et al. |

FOREIGN PATENT DOCUMENTS

| | | | |
|---|---|---|---|
| JP | 2006-269761 A | 10/2006 | |
| JP | 2008-140856 A | 6/2008 | |
| JP | 2009-148866 A | 7/2009 | |
| JP | 2010-034461 A | 2/2010 | |
| JP | 2011-077508 A | 4/2011 | |
| JP | 2015-008247 A | 1/2015 | |
| JP | 2017-098446 A | 6/2017 | |
| JP | 2017-210396 A | 11/2017 | |
| JP | 2018074018 A | * 5/2018 | ............... B24B 7/22 |
| KR | 10-2015-0001611 A | 1/2015 | |
| KR | 10-2018-0067657 A | 6/2018 | |
| TW | 201826367 A | 7/2018 | |

OTHER PUBLICATIONS

[NPL-1] Matagawa et al. (JP 2018-074018 A), May 10, 2018 (EPO machine translation to English). (Year: 2018).*
Jun. 21, 2024 Office Action issued in Taiwanese Patent Application No. 110110288.
Jun. 12, 2024 Extended Search Report issued in European Patent Application No. 21808888.8.
May 25, 2021 Search Report Issued in International Patent Application No. PCT/JP2021/010731.
Nov. 4, 2020 Office Action issued in Japanese Patent Application No. 2020-088949.
Nov. 17, 2022 International Preliminary Report on Patentability issued in International Patent Application No. PCT/JP2021/010731.
Feb. 6, 2025 Office Action issued in Korean Patent Application No. 10-2022-7039239.
Mar. 21, 2025 Office Action issued in Singaporean Patent Application No. 10202403193Y.

* cited by examiner

*Primary Examiner* — Leo B Tentoni
(74) *Attorney, Agent, or Firm* — Oliff PLC (57) ABSTRACT

A manufacturing method for a substrate wafer, including: a wafer having a first and second main surface; forming a flattening resin layer on second main surface; with the flattening resin layer adsorbed and held as a reference surface, grinding or polishing first main surface as a first processing; removing flattening resin layer from the wafer; with the wafer's first main surface subjected to the first processing adsorbed and held, grinding or polishing second main surface as a second processing; with the second main surface subjected to second processing adsorbed and held, further grinding or polishing first main surface as a third processing; with first main surface subjected to third processing adsorbed and held, further grinding or polishing second main surface as a fourth processing to obtain a substrate wafer, wherein first processing and/or third processing is executed such that the wafer has a central concave or central convex thickness distribution.

15 Claims, 5 Drawing Sheets

MANUFACTURING METHOD FOR A SUBSTRATE WAFER

TECHNICAL FIELD

The present invention relates to a manufacturing method for a substrate wafer and a substrate wafer.

BACKGROUND ART

When epitaxial layer is grown on a substrate wafer, a warp may occur due to lattice mismatch. The countermeasure therefor includes manufacturing of a substrate wafer having a warp in a direction opposite to the warp of the epitaxial layer, the method including grinding or polishing the substrate wafer (Patent Document 1)

Further, there is a problem that in a bonded substrate such as SOI, stress may occur between an oxide film and silicon side due to a difference in coefficient of thermal expansion, so that a warp occurs when the oxide film only on one side is removed.

On the other hand, a waviness shorter in wavelength than a swelling and warp, which is called nanotopography, has become a problem in recent years (Patent Document 2).

CITATION LIST

Patent Literature

Patent Document 1: JP 2008-140856 A
Patent Document 2: JP 2017-098446 A
Patent Document 3: JP 2006-269761 A
Patent Document 4: JP 2009-148866 A

SUMMARY OF INVENTION

Technical Problem

Here, a manufacturing method for a substrate wafer, which is a conventional example, will be described with reference to FIG. 5.

Figure 5:
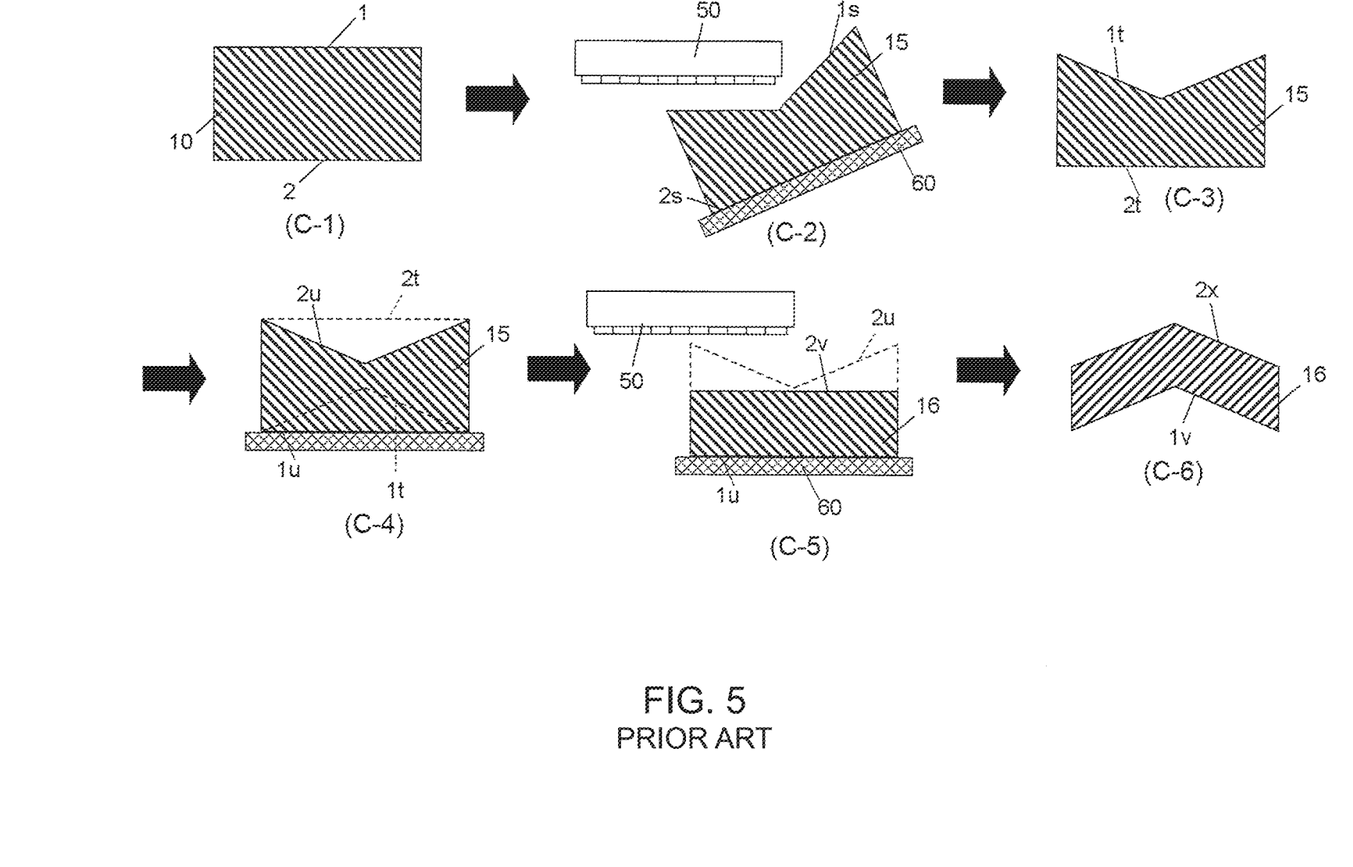
FIG. 5 is a schematic sectional view illustrating a conventional manufacturing method for the substrate wafer.

According to the manufacturing method shown in FIG. 5, first of all, a wafer 10 which is an object to be processed shown in (C-1) is provided. The wafer 10 has a first main surface 1 and a second main surface 2 which is on an opposite side to the first main surface 1. Next, as shown in (C-2), the second main surface 2 of the wafer 10 is adsorbed and held on a chuck table 60. This adsorption leads to the elastic deformation of the wafer 10, so that the second main surface 2 is also deformed elastically to a second main surface 2s.

Next, as shown in (C-2), the first main surface 1 of the wafer 10 is ground or polished with a grinding wheel 50. At this time, as shown in (C-2), an angle of the first main surface 1 with respect to the grinding wheel 50 is adjusted by adjusting an axial angle of the chuck table 60 so that the wafer 10 is turned to a wafer 15 having a central concave thickness distribution (central concave TTV) corresponding to a desired warp value to be obtained in this method. As a result of this processing, the wafer 15 having a processed first main surface 1s is obtained.

Next, the adsorption with the chuck table 60 is released. Consequently, as shown in (C-3), the wafer 15 having a released first main surface 1t and a released second main surface 2t is obtained.

Next, the obtained wafer 15 is inverted such that the released second main surface 2t faces upward as shown in (C-4) and then, the first main surface 1t of the wafer 15 is adsorbed and held on the chuck table 60. This adsorption leads to the elastic deformation of the wafer 15. At this time, the processed first main surface 1t indicated with a dotted line in (C-4) is deformed elastically to a first main surface 1u following the surface of the chuck table 60. On the other hand, the second main surface 2t indicated with a dotted line in (C-4) is deformed elastically to a second main surface 2u having an external shape corresponding to the external shape of the released first main surface 1t.

Next, in this condition as shown in (C-5), the second main surface 2u of the wafer 15 indicated with a dotted line in (C-5) is ground or polished using the grinding wheel 50. Consequently, a wafer 16 having a processed second main surface 2v is obtained.

Finally, the obtained wafer 16 is released from the chuck table 60. As a result, the wafer 16 having a warp with a central concave first main surface iv and a central convex second main surface 2x is obtained as shown in (C-6).

The above-described method enables a substrate wafer 16 having a desired warp value to be obtained. However, the substrate wafer 16 obtained in this method has such a problem that its nanotopography value is large.

As a countermeasure for the nanotopography, for example, Patent Document 2 describes a wafer-grinding method in which to apply an appropriate grinding pressure to each pressure zone while suppressing influence of the nanotopography, a nanotopography map of a wafer surface is measured and the grinding pressure of a grinding head for the wafer is set up based on the measurement result followed by executing the grinding processing. Further, there is another method of coating a single side of the wafer with resin followed by grinding in order to improve the nanotopography of the substrate wafer. For example, Patent Document 3 describes a wafer manufacturing method in which a single (rear) surface of a sliced wafer is coated with curable material in a thickness of 40 to 300 µm and after curing, an opposite side (front) surface is ground while holding the coated surface so that waviness is removed a wafer having an even thickness is obtained. Further, Patent Document 4 describes a resin applying method for applying ultraviolet ray curable resin in a thickness of 10 to 200 µm for the method described in Patent Document 3 and an apparatus for this method.

However, these methods could not obtain a substrate wafer having a desired warp value, namely, a desired warp.

Although as described above, the substrate wafer for epitaxial growth or bonding is demanded to have a warp and an excellent nanotopography, there existed no wafer which can satisfy both the requirements and no manufacturing method thereof.

The present invention has been achieved to solve the above-described problem, and an object thereof is to provide a substrate wafer-manufacturing method capable of manufacturing a substrate wafer having a warp and an excellent nanotopography, and such a substrate wafer having a warp and an excellent nanotopography.

Solution to Problem

To achieve the above-described object, the present invention provides a manufacturing method for a substrate wafer, comprising:

providing a wafer having a first main surface and a second main surface on an opposite side to the first main surface;

forming a flattening resin layer on the second main surface of the wafer;

adsorbing and holding the flattening resin layer as a reference surface, and, with this condition, grinding or polishing the first main surface of the wafer as a first processing;

removing the flattening resin layer from the wafer;

adsorbing and holding the first main surface of the wafer subjected to the first processing, and, with this condition, grinding or polishing the second main surface of the wafer as a second processing;

adsorbing and holding the second main surface subjected to the second processing of the wafer, and, with this condition, further grinding or polishing the first main surface of the wafer as a third processing;

adsorbing and holding the first main surface subjected to the third processing of the wafer, and, with this condition, further grinding or polishing the second main surface of the wafer as a fourth processing to obtain a substrate wafer, wherein the first processing and/or the third processing is executed such that the wafer has a central concave or central convex thickness distribution.

In the manufacturing method for the substrate wafer of the present invention in which the first processing is executed to the first main surface of the wafer with the flattening resin layer adsorbed and held as a reference surface, next, the second processing to the second main surface of the wafer is executed with the first main surface subjected to the first processing adsorbed and held, and next, the third processing to the first main surface of the wafer is executed with the second main surface subjected to the second processing adsorbed and held, and next, the fourth processing to the second main surface of the wafer is executed with the first main surface subjected to the third processing adsorbed and held, wherein the first processing and/or the third processing is executed such that the wafer has a central concave or a central convex thickness distribution. According to such a method, the substrate wafer having a large warp value, namely, a warp and a small nanotopography, namely, excellent nanotopography can be manufactured. Further, because the substrate wafer which can be manufactured according to the present invention has a warp and an excellent nanotopography, this is available as a substrate for epitaxial growth or bonding.

Preferably, the first processing is executed such that a thickness distribution α [μm] of the wafer obtained by the first processing is 50% or less of a warp value w [μm] of the substrate wafer obtained by the fourth processing.

By executing the first processing in this manner, the wafer thickness adjustment amount by the first processing can be smaller than the wafer thickness adjustment amount by the third processing, thereby providing a substrate wafer having a smaller nanotopography.

Preferably, the flattening resin layer is formed such that a variation in thickness of the flattening resin layer is 25% or less of the warp value w [μm] of the substrate wafer.

By forming the flattening resin layer in this manner, an influence of a variation in thickness of the flattening resin layer upon the thickness of a wafer obtained by the first processing can be decreased, thereby bringing the warp value of the substrate wafer subjected to the processing near a target value.

The first processing to the fourth processing can be executed such that the warp value w [μm] of the substrate wafer is 40 μm or more.

According to the manufacturing method for the substrate wafer of the present invention, the substrate wafer whose warp value w [μm] is 40 μm or more can be manufactured.

The wafer can be processed such that it has a central convex thickness distribution in the first processing and/or the third processing.

Alternatively, the wafer can be processed such that it has a central concave thickness distribution in the first processing and/or the third processing.

In the first processing and/or the third processing, the wafer thickness distribution can be adjusted to a central convex shape or central concave shape corresponding to a desired shape of a substrate wafer to be manufactured. Specifically, when the second main surface of the wafer is regarded as a front surface, by making the water thickness distribution into a central concave shape by the first processing and/or the third processing, a substrate wafer having the central convex warp can be manufactured. On the other hand, when the second main surface of the wafer is regarded as a front surface, by making the wafer thickness distribution into a central convex shape by the first processing and/or the third processing, a substrate wafer having the central concave warp can be manufactured.

Preferably, the a resin which is a precursor of the flattening resin layer is applied to the second main surface of the wafer, a load is applied to the resin, and the resin applied with the load is cured to form the flattening resin layer.

By forming the flattening resin layer in this manner, a variation in thickness of the flattening resin layer can be suppressed thereby enabling a substrate wafer having a smaller nanotopography to be manufactured.

Further, the present invention provides a substrate wafer comprising a central convex or a central concave warp and wherein a nanotopography in 2 mm×2 mm in SQMM is less than 10 nm.

Because such a substrate has a warp and an excellent nanotopography, it is available as a substrate for epitaxial growth or bonding.

The substrate wafer preferably has a nanotopography which is 5 nm or less.

Such a substrate wafer is more available as a substrate for epitaxial growth or bonding.

The substrate wafer preferably has a warp value w [μm] which is 40 μm or more.

Such a substrate wafer is more available as a substrate for epitaxial growth or bonding.

Advantageous Effect of Invention

As described above, the manufacturing method for the substrate wafer according to the present invention can manufacture a substrate wafer which has a large Warp value, namely a desired warp, and a small nanotopography, namely excellent nanotopography. Further, the substrate wafer which can be manufactured according to the manufacturing method for the substrate wafer of the present invention has a desired warp and an excellent nanotopography, and, therefore, is available as a substrate for epitaxial growth or bonding.

Further, the substrate wafer according to the present invention has a desired warp and an excellent nanotopography, and, therefore, is available as a substrate for epitaxial growth or bonding. By using such a substrate wafer, a substrate having finally no warp and an excellent nanotopography for epitaxial growth or bonding can be obtained.

DESCRIPTION OF EMBODIMENTS

As described above, development of a manufacturing method for a substrate wafer capable of manufacturing the substrate wafer having a desired warp and an excellent nanotopography and the substrate wafer having the desired warp and excellent nanotopography has been demanded.

As a result of accumulated considerations on the above object, an inventor of the present invention et al. have found out that by executing a first processing to a first main surface of a wafer with a flattening resin layer adsorbed and held as a reference surface, next, executing a second processing to a second main surface of the wafer with the first main surface subjected to the first processing adsorbed and held, next, executing a third processing to the first main surface of the wafer with the second main surface subjected to the second processing adsorbed and held, and then, executing a fourth processing to the second main surface of the wafer with the first main surface subjected to the third processing adsorbed and held, so that the first processing and/or the third processing is executed such that the wafer has a central concave or a central convex thickness distribution, a substrate wafer having a large Warp value, namely a large warp, and a small nanotopography, namely excellent nanotopography, can be manufactured, and then have completed the present invention.

The present invention relates to a manufacturing method for a substrate wafer, comprising:
providing a wafer having a first main surface and a second main surface on an opposite side to the first main surface;
forming a flattening resin layer on the second main surface of the wafer;
adsorbing and holding the flattening resin layer as a reference surface, and, with this condition, grinding or polishing the first main surface of the wafer as a first processing;
removing the flattening resin layer from the wafer;
adsorbing and holding the first main surface of the wafer subjected to the first processing, and, with this condition, grinding or polishing the second main surface of the wafer as a second processing;
adsorbing and holding the second main surface subjected to the second processing of the wafer, and, with this condition, further grinding or polishing the first main surface of the wafer as a third processing;
adsorbing and holding the first main surface subjected to the third processing of the wafer, and, with this condition, further grinding or polishing the second main surface of the wafer as a fourth processing to obtain a substrate wafer,
wherein the first processing and/or the third processing is executed such that the wafer has a central concave or central convex thickness distribution.

Further, the present invention relates to a substrate wafer comprising a central convex or a central concave warp and wherein a nanotopography in 2 mm×2 mm in SQMM is less than 10 nm.

Hereinafter, the present invention will be described in detail with reference to drawings. However, the present invention is not restricted thereto.

[Manufacturing Method for Substrate Wafer]

The manufacturing method for the substrate wafer of the present invention mentioned above will be described below with providing of a wafer and formation of a flattening resin layer as Step 1, then, a first processing and removal of the flattening resin layer as Step 2, a second processing as Step 3, a third processing as Step 4, and a fourth processing as Step 5.

(Step 1)

Figure 1:
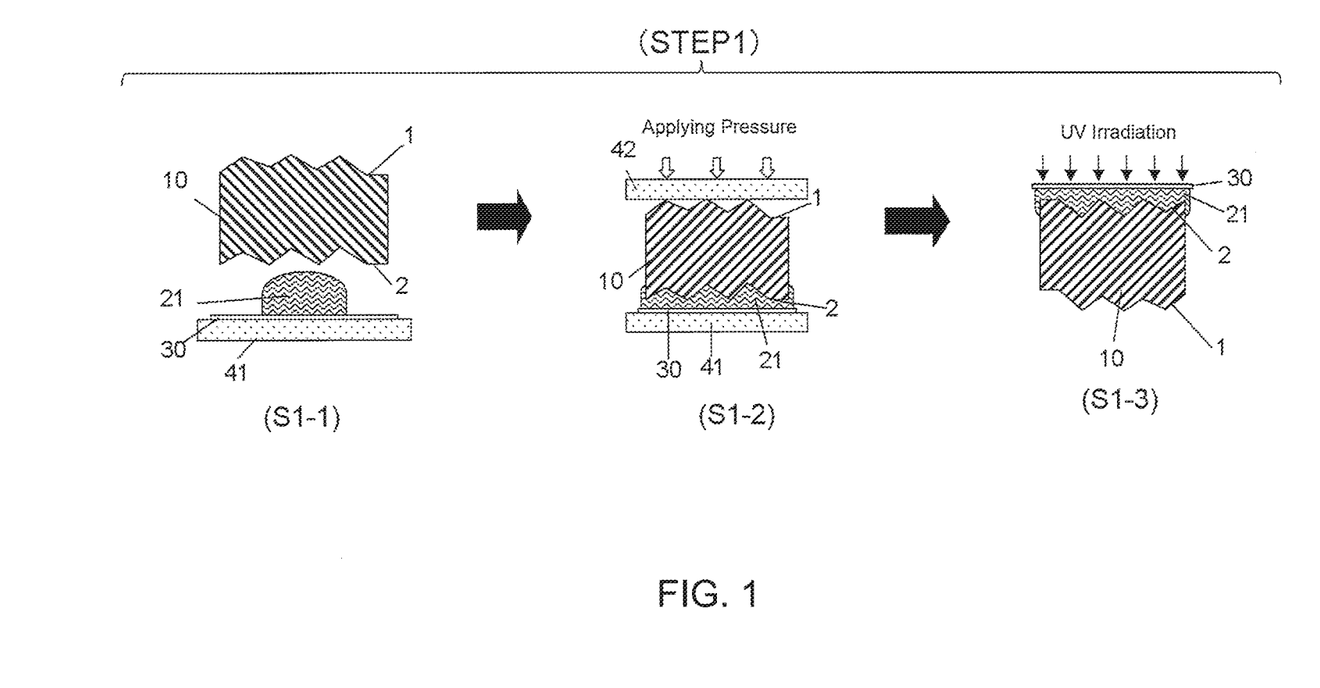
FIG. 1 is a schematic sectional view illustrating Step 1 in an example of the manufacturing method for the substrate wafer of the present invention.

First, as shown in (S1-1) of FIG. 1, a wafer 10 which is an object to be processed is provided. The wafer 10 has a first main surface 1 and a second main surface 2 on an opposite side of the first main surface 1. Should be noted that, although unevenness of each of the surfaces which are the first main surface and the second main surface is expressed exaggeratingly for the sake of explanation, surface roughness of each of the first main surface and the second main surface is not restricted to any particular one.

The wafer 10 to be provided is not restricted to any particular one as long as it is available as raw material for the substrate wafer, for example, raw material for the substrate wafer for epitaxial growth or bonding.

On the other hand, a lower plate 41 having a flat surface is provided. An optical transparent film 30 which is transparent to ultraviolet ray, for example, is placed on the lower plate 41. Next, resin 21 with plasticity, for example in liquid-state, which is a precursor of a flattening resin layer, is supplied and applied to the optical transparent film 30. In an example of FIG. 1, ultraviolet ray (UV) curable resin is used as the resin 21. However, the material of the resin 21 is not restricted to any particular one.

Next, the first main surface 1 of the wafer 10 is adsorbed and held on the upper plate 42. Then, as shown in (S1-2), the wafer 10 in this condition is placed on the resin 21 such that the second main surface 2 makes contact with the resin 21. Consequently, the resin 21 which is a precursor of the flattening resin layer is applied onto the second main surface 2 of the wafer 10. Next, the wafer 10 is pressed with a predetermined load (a predetermined load is applied by pressing) through the upper plate 42 such that the surface of the resin 21 is flat.

By adjusting an applied pressure at this time, a variation in thickness of the resin 21 can be adjusted. Appropriate pressing can cause the resin to be spread appropriately so that an appropriate resin thickness distribution can be obtained. The variation in thickness of the resin is preferably 25% or less, more preferably 15% or less, of a desired warp value w [µm] of a substrate wafer to be manufactured according to the manufacturing method of the present invention. Ideally, the variation in thickness of the resin is 0% or more of the desired warp value w [µm] of the substrate wafer to be manufactured according to the manufacturing method of the present invention, for example, it may be 5% or more.

Next, the wafer 10 on which the resin 21 and the optical transparent film 30 are mounted is removed from the upper plate 42 and the lower plate 41. As shown in (S1-3), the removed wafer 10 is irradiated with ultraviolet ray from a side of the optical transparent film 30 to cure the resin 21. Should be noted that the curing treatment on the resin 21 is changed depending on material of the resin 21. Unless the photo-curing treatment is executed, placing of the optical transparent film 30 may be omitted.

Figure 2:
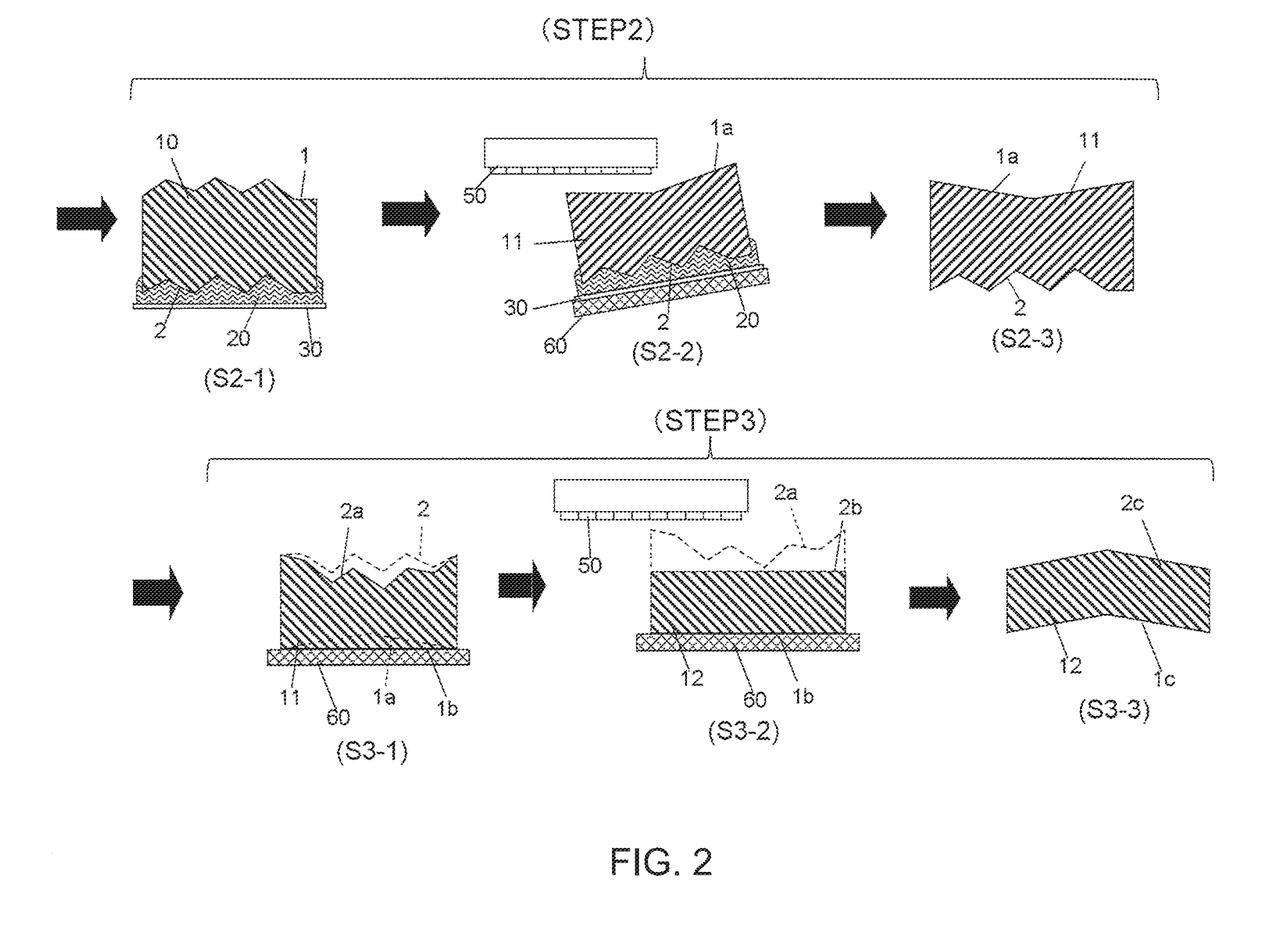
FIG. 2 is a schematic sectional view illustrating Step 2 and Step 3 in the example of the manufacturing method for the substrate wafer of the present invention.

By this curing treatment, the wafer 10 with the flattening resin layer 20 is obtained as shown in (S2-1) of FIG. 2.

(Step 2)

The wafer 10 with the flattening resin layer 20 shown in (S2-1) of FIG. 2 obtained above is adsorbed and held to the chuck table 60 shown in (S2-2) with the flattening resin layer 20 as reference surface. This chuck table 60 is made of, for example, porous ceramic and capable of holding the wafer 10 through vacuum adsorption. Further, the chuck table 60 has a function of adjusting the axial angle of the wafer 10 with respect to a grinding or polishing means. However, in the present invention, a means for adsorbing and holding the wafer 10 is not limited to any particular one.

Should be noted that, although the optical transparent film 30 keeps contact with the chuck table 60 in (S2-2), the optical transparent film 30 does not disturb adsorption and holding because the optical transparent film 30 has a smaller thickness than that of the wafer 10 and that of the flattening resin layer 20.

Next, as shown in (S2-2), the first main surface 1 of the adsorbed and held wafer 10 is ground or polished as a first processing. Although an example of grinding with a grinding wheel 50 is shown in (S2-2), the means for grinding or polishing is not limited to any particular one. According to the present invention, in the first processing and/or the third processing which will be described later, the wafer is processed so as to have a central concave or a central convex thickness distribution. There is shown in (S2-2) an example in which the first main surface 1 of the wafer 10 is ground as the first processing to obtain a wafer 11 having the first main surface 1a subjected to the first processing and having a central concave thickness distribution.

Next, the wafer 11 subjected to the first processing is released from the chuck table 60. Next, the flattening resin layer 20 and the optical transparent film 30 are removed from the wafer 11. Consequently, the wafer 11 as shown in (S2-3) is obtained. The obtained wafer 11 has the first main surface 1a subjected to the first processing and the second main surface 2 on the opposite side to the first main surface 1a. Further, the wafer 11 has a central concave thickness distribution (central concave TTV).

(Step 3)

Next, the wafer 11 obtained in Step 2 is inverted such that the second main surface 2 faces upward as shown in (S3-1) in FIG. 2 and the first main surface 1a subjected to the first processing is adsorbed and held on the chuck table 60. This adsorption leads to elastic deformation of the wafer 11. At this time, the first main surface 1a subjected to the first processing indicated with a dotted line in (S3-1) is also deformed elastically to a first main surface 1b following the surface of the chuck table 60. On the other hand, the second main surface 2 indicated with a dotted line in (S3-1) is deformed elastically so that it is displaced downward to a second main surface 2a.

Next, the second main surface 2a of the wafer 11 adsorbed and held with this condition is ground or polished as a second processing. There is shown in (S3-2) an example in which the second main surface 2a indicated with a dotted line is ground by using the grinding wheel 50 as a grinding means. The second processing is executed by grinding or polishing so that the wafer thickness is flat as shown in (S3-2). As a result of the second processing, a wafer 12 having a second main surface 2b subjected to the second processing as shown in (S3-2) is obtained.

Next, the obtained wafer 12 is released from the chuck table 60 to obtain the wafer 12 in a state shown in (S3-3). By releasing from the adsorption, the first main surface 1b subjected to the first processing is deformed to a central concave first main surface 1c. On the other hand, the second main surface 2b subjected to the second processing is deformed to a central convex second main surface 2c. Therefore, as shown in (S3-3), the wafer 12 is a wafer which has a central convex warp when the second main surface 2c is regarded as a front surface.

(Step 4)

Figure 3:
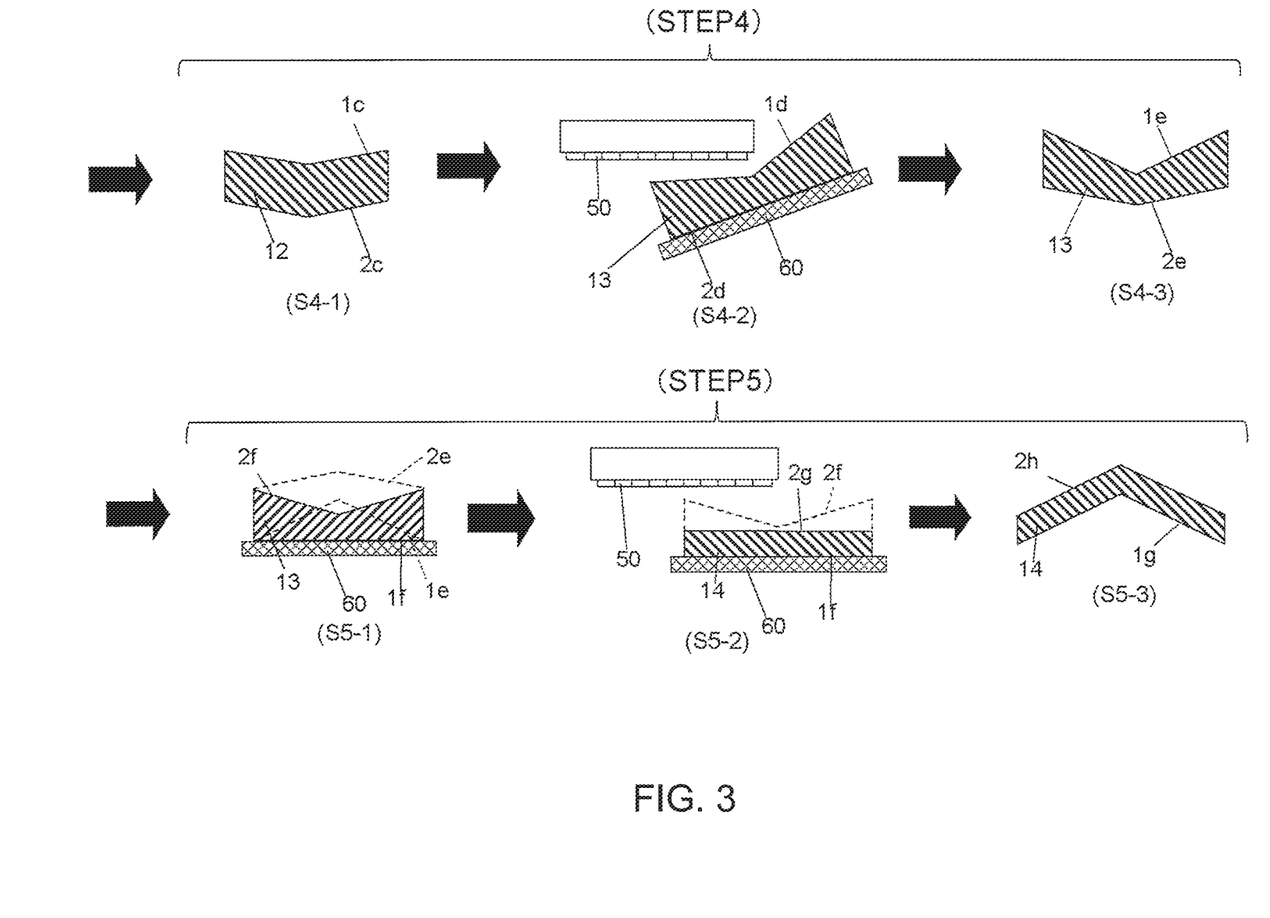
FIG. 3 is a schematic sectional view illustrating Step 4 and Step 5 in the example of the manufacturing method for the substrate wafer of the present invention.

Next, the wafer 12 obtained in Step 3 is inverted such that the first main surface 1c subjected to the first processing faces upward as shown in (S4-1) in FIG. 3. The second main surface 2c subjected to the second processing of the wafer 12 in this orientation is adsorbed and held on the chuck table 60. By this adsorption leads to the elastic deformation of the wafer 12. At this time, the second main surface 2c subjected to the second processing is also deformed elastically to a second main surface 2d following the surface of the chuck table 60, as shown in (S4-2). Although not shown, the first main surface 1c subjected to the first processing is also deformed elastically.

The first main surface 1c of the wafer 12 in this condition is ground or polished as the third processing. Although an example of grinding with the grinding wheel 50 is shown in (S4-2), the means for grinding or polishing is not limited to any particular one. As described above, according to the present invention, the first processing and/or the third processing is executed such that the wafer has a central concave or a central convex thickness distribution. There is shown in (S4-2) an example in which the first main surface 1c of the wafer 12 is ground as the third processing to obtain a wafer 13 having the first main surface 1d subjected to the third processing and having a central concave thickness distribution.

Next, the wafer 13 subjected to the third processing is released from the chuck table 60. Thus, the wafer 13 shown in (S4-3) is obtained. The obtained wafer 13 has the central concave first main surface 1e subjected to the third processing and the central convex second main surface 2e subjected to the second processing on the opposite side to the first main surface 1e. Further, the wafer 13 has a central concave thickness distribution (central concave TTV).

(Step 5)

Next, the wafer 13 obtained in Step 4 is inverted such that the second main surface 2e faces upward as shown in (S5-1) in FIG. 3 and the first main surface 1e subjected to the third processing is adsorbed and held on the chuck table 60. This adsorption leads to the elastic deformation of the wafer 13. At this time, the first main surface 1e subjected to the third processing indicated with a dotted line in (S5-1) is also deformed elastically to a first main surface 1f following the surface of the chuck table 60. On the other hand, the second main surface 2e indicated with a dotted line in (S5-1) is deformed elastically and displaced downward to a second main surface 2f.

Next, the second main surface 2f subjected to the second processing of the wafer 13 thus adsorbed and held is ground or polished as a fourth processing. There is shown in (S5-2) an example in which the second main surface 2f indicated with a dotted line is ground by using the grinding wheel 50 as a grinding means. In the fourth processing, grinding or polishing is executed so that the wafer thickness is flat as shown in (S5-2). As a result of the fourth processing, a substrate wafer 14 having a second main surface 2g subjected to the fourth processing as shown in (S5-2) is obtained.

Next, the obtained substrate wafer 14 is released from the chuck table 60 to obtain the substrate wafer 14 in a state shown in (S5-3). By releasing from the adsorption, the first main surface 1f subjected to the third processing is deformed to a central concave first main surface 1g. On the other hand, the second main surface 2g subjected to the fourth processing is also deformed to a central convex second main surface 2h. As a result, as shown in (S5-3), the substrate wafer 14 is a wafer which has a central convex warp when the second main surface 2h is regarded as a front surface.

Figure 4:
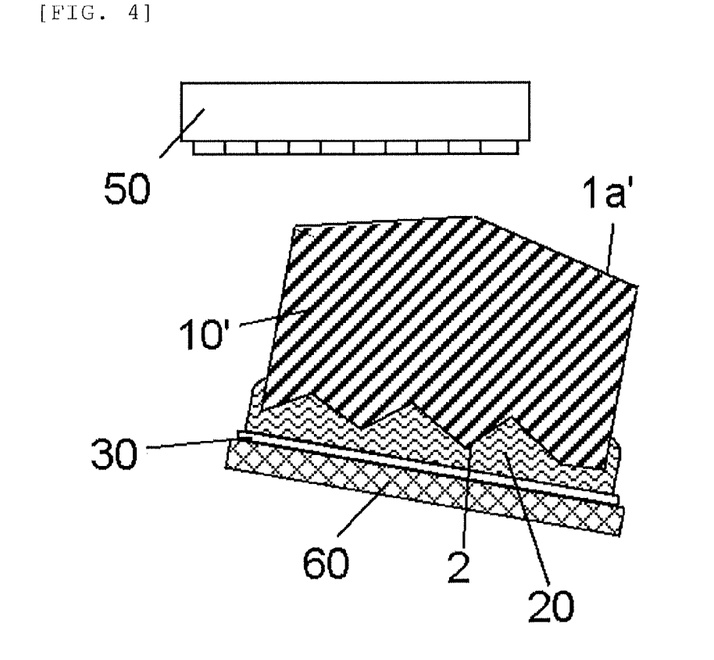
FIG. 4 is a schematic sectional view illustrating the first processing in other example of the manufacturing method for the substrate wafer of the present invention.

According to the present invention, the first processing and/or the third processing is executed such that the wafer has a central concave or a central convex thickness distribution, which has been described before. The thickness distribution can be adjusted by adjusting the axial angle of the chuck table. For example, in order to execute processing to obtain a central convex thickness distribution, the axial angle of the chuck table 60 with respect to the grinding or polishing means (grinding wheel 50 in FIG. 4) is adjusted as shown in FIG. 4, for example. As a result, the wafer 10' having a central convex first main surface 1a' and a central convex thickness distribution is obtained as shown in 4.

By executing the first processing and/or the third processing such that the wafer has a central concave thickness distribution, as described with reference to FIG. 1 to FIG. 3, the substrate wafer having the central convex warp can be obtained when the second main surface is regarded as a front surface. On the other hand, by executing the first processing and/or the third processing such that the wafer has a central convex thickness distribution, the substrate wafer having the central concave warp can be obtained when the second main surface is regarded as a front surface.

In the manufacturing method for the substrate wafer according to the present invention described above with reference to the examples, the wafer thickness distribution (variation in thickness) is adjusted in the first processing and/or the third processing. Additionally, in the first processing and the third processing executed with the flattening resin layer formed on the wafer, the first main surface is ground or polished, and, further, the second main surface is also subject to twice grinding or polishing by the second processing and the fourth processing. As a result, the manufacturing method for the substrate wafer according to the present invention can manufacture the substrate wafer which has a large Warp value, namely a desired warp, and a small nanotopography, namely an excellent nanotopography.

Preferably, the first processing is executed such that the thickness distribution α [µm] of a wafer obtained by the first processing is 50% or less of the Warp value w [µm] of a substrate wafer obtained by the fourth processing. That is, the wafer thickness adjustment amount by the first processing is desirably smaller than the wafer thickness adjustment amount by the third processing. By executing the first processing and the third processing in this manner, a substrate wafer having a more small nanotopography can be manufactured. For example, the first processing can be executed such that the thickness distribution α [µm] of a wafer obtained by the first processing is 0% or more of the Warp value w [µm] of a substrate wafer obtained by the fourth processing.

In the present invention, a processing to make the thickness distribution central convex or central concave is executed in one of the first processing or the third processing, while no thickness distribution adjustment is needed in the other. In processing which needs no thickness distribution adjustment, the grinding or polishing for flattening may be executed with a processing face (e.g., grinding wheel or polishing pad) of the grinding or polishing means pressed onto the first main surface of the wafer in parallel.

The first processing to the fourth processing may be executed such that the Warp value w [µm] of the substrate wafer is 40 µm or more. Further, the first processing to the fourth processing may be executed such that the Warp value w [µm] of the substrate wafer is 200 µm or more, for example.

According to the manufacturing method for the substrate wafer of the present invention, the substrate wafer whose Warp value w [µm] is 40 µm or more can be manufactured.

The substrate wafer obtained by the fourth processing is preferably subjected to mirror polishing. Particularly, for the epitaxial layer formation or bonding, a surface on which the epitaxial layer formation or the bonding is to be executed is preferred to be subjected to mirror polishing. It is preferable to mirror-polish both surfaces of the first main surface and the second main surface of the substrate wafer. By the mirror-polishings of the both surfaces, a warp shape created by the first processing to the fourth processing can be maintained more securely.

[Substrate Wafer]

Further, the substrate wafer of the present invention has a central convex or a central concave warp and its nanotopography in 2 mm×2 mm in SQMM is less than 10 nm.

Because such a substrate wafer has a warp and an excellent nanotopography, it is available as a substrate for epitaxial growth or bonding.

The substrate wafer of the present invention may be manufactured according to, for example, the manufacturing method for the substrate wafer of the present invention.

The substrate wafer preferably has a nanotopography of 5 nm or less.

Such a substrate wafer is available as a substrate for epitaxial growth or bonding.

The smaller the nanotopography in 2 mm×2 mm in SQMM of the substrate wafer, the more preferable it is. The nanotopography may be 0 nm or more.

The warp value w [µm] of the substrate wafer is preferably 40 µm or more.

Such a substrate wafer is available as a substrate for epitaxial growth or bonding.

The warp value w [µm] of the substrate wafer may be, for example, 200 µm or less.

EXAMPLES

Hereinafter, the present invention will be described in detail with reference to Examples and Comparative Example. However, the present invention is not restricted thereto.

Examples 1, 2, 3-1, 3-2, 3-3, 4 and 5

In Examples 1, 2, 3-1, 3-2, 3-3, 4 and 5, substrate wafers were manufactured in following procedures. The desired Warp value w was set to be 40 µm.

(Step 1)

First of all, following materials were provided.

As a wafer to be processed, a P-type Si single crystal wafer having a diameter of 300 nm and plain orientation <100>, and having a first main surface and a second main surface on the opposite side the first main surface was provided.

As a precursor of the flattening resin layer (applied material), ultraviolet ray curable resin was provided.

As an optical transparent film, a PET film was provided.

Next, the PET film was placed on a flat glass plate (lower plate) and 10 ml of ultraviolet ray curable resin was dropped on the PET film.

The first main surface of the wafer was adsorbed and held on a ceramic plate (upper plate) and the wafer was pressed onto the resin and bonded thereto.

The control of the applied pressure was executed with a servo motor holding the ceramic plate, and a load was applied until a predetermined load L was detected.

Considering an influence due to variation in resin thickness, here, the above predetermined load L was set to be 2,000 N in Examples 1, 2, 3-1, 4 and 5, 1,900 N in Example 3-2 and 1,800 N in Example 3-3.

After pressing, the ultraviolet ray curable resin was irradiated with ultraviolet ray from the PET film side to cure the above resin, thereby forming the flattening resin layer on the second main surface of the wafer. As a light source for curing the resin, a UV-LED having 365 nm in wavelength was used.

The thickness of obtained flattening resin layer was measured under a following condition.

As a resin thickness measuring optical sensor, Keyence's SI-T80 was used.

By scanning the wafer linearly with the sensor fixed, a thickness profile was measured.

The measurement was executed at 1,160 points by a pitch of 0.25 mm on a single measurement line.

Difference a maximum value to a minimum value in four resin-thickness profiles measured equally radially was regarded as a variation in resin thickness.

Table 1 shows a measurement result.

(Step 2 to Step 5)

Next, the wafer on which the flattening resin layer was formed was subjected to the first processing to the fourth processing under a following condition.

(General)

Disco's DFG8360 was used for grinding.

A grinding wheel to which diamond abrasive grains were bonded was used.

As a chuck table, a porous ceramic chuck table was used. This chuck table can vacuum adsorb and hold a main surface on one side of a wafer. Further, this chuck table had a function of adjusting the axial angle with respect to the grinding wheel.

<Condition of First Processing (Grinding of First Main Surface) (Step 2)>

The axial angle of the chuck table was adjusted such that the wafer thickness distribution was central concave $\alpha$ μm and then the processing was executed.

With the flattening resin layer vacuum-adsorbed, the first main surface (rear surface) was ground.

After the grinding, the flattening resin layer was removed from the wafer.

Should be noted that, in Example 1, without adjusting the wafer thickness distribution in the first processing ($\alpha$=0 μm), grinding for fattening the surface was executed such that the wafer thickness distribution was 1 μm or less.

<Condition of Second Processing (Grinding of Second Main Surface) (Step 3)>

The axial angle of the chuck table was adjusted such that the wafer thickness distribution was 1 μm or less and then the processing was executed.

While vacuum-adsorbing the first main surface (rear surface) subjected to the first processing, the second main surface (front surface) was ground.

<Condition of Third Processing (Grinding of First Main Surface) (Step 4)>

The axial angle of the chuck table was adjusted such that the wafer thickness distribution was central concave $\beta$ μm and then the processing was executed.

While vacuum-adsorbing the second main surface (front surface) subjected to the second processing vacuum-adsorbed, the first main surface (rear surface) subjected to the first processing was ground.

Should be noted that, in Example 5, without adjusting wafer thickness distribution in the third processing ($\beta$=0 μm), grinding for fattening the surface was executed such that the wafer thickness distribution was 1 μm or less.

<Condition of Fourth Processing (Grinding of Second Main Surface) (Step 5)>

The axial angle of the chuck table was adjusted such that the wafer thickness distribution was 1 μm or less and then the processing was executed.

While vacuum-adsorbing the first main surface (rear surface) subjected to the third processing, the second main surface (front surface) subjected to the second processing was ground.

As the above-described adjustment amounts $\alpha$ and $\beta$ of the wafer thickness distribution, values for Examples 1, 2, 3-1, 3-2, 3-3, 4 and 5, mentioned in Table 1 was set.

(Finishing)

In each of Examples, both the front and rear surfaces of substrate wafer obtained after the fourth processing were mirror-ground. Consequently, the substrate wafer of each of Examples was obtained.

Comparative Example

On the other hand, as Comparative Example, a substrate wafer was manufactured in the same procedure as Example 1, except that the formation of the flattening resin layer, the first processing and the second processing were skipped, the axial angle of the chuck table was adjusted such that the wafer thickness distribution was central concave 40 μm and then grinding was executed as the third processing, and next, the axial angle of the chuck table was adjusted such that the wafer thickness distribution was 1 μm or less and then grinding was executed as the fourth processing.

[Measurement of Warp and Nanotopography]

The Warp and nanotopography of the substrate wafer of each of Examples and the Comparative Example were measured. For the measurement, an optical interferometry flatness/nanotopography measuring apparatus (Wafer Sight 2, made by KLA) was used.

As an index for the nanotopography, SQMM 2 mm×2 mm was used. Table 1 below shows the results.

TABLE 1

| | Comparative Example | Example 1 | Example 2 | Example 3-1 | Example 3-2 | Example 3-3 | Example 4 | Example 5 |
|---|---|---|---|---|---|---|---|---|
| Resin Pressuring Load [N] | — | 2000 | 2000 | 2000 | 1900 | 1800 | 2000 | 2000 |
| Resin Thickness Distribution [μm] | — | 7.3 | 7.9 | 6.8 | 9.8 | 13.1 | 6.3 | 7.1 |
| Adjustment Amount (α) [μm] of Wafer Thickness Distribution in First Processing | — | 0 | 10 | 20 | 20 | 20 | 30 | 40 |
| Adjustment Amount (β) [μm] of Wafer Thickness Distribution in Third Processing | 40 | 40 | 30 | 20 | 20 | 20 | 10 | 0 |
| Warp [μm] | 45.2 | 41.5 | 40.8 | 43.2 | 40.3 | 35.7 | 42.1 | 40.6 |
| Nanotopography | x | ○ | ○ | ○ | ○ | ○ | Δ | Δ |

As for the nanotopography, numerical results in SQMM 2 mm×2 mm were evaluates as follows.

○: less than 5 nm
Δ: 5 nm or more to less than 10 nm
x: 10 nm or more

Apparent from the results shown in Table 1, in each of Examples 1, 2, 3-1, 3-2, 3-3, 4 and 5, there was obtained a substrate wafer in which the warp value was 35.7 μm or more and the nanotopography was less than 10 nm and excellent. These results were provided by, in each of Examples, executing the first processing with the flattening resin layer formed on the wafer, grinding the first main surface to adjust the wafer thickness distribution in this first processing and the third processing, and subjecting the second main surface to grinding twice in the second processing and the fourth processing.

On the other hand, in Comparative Example, although the achieved value of Warp was 40 μm or more which is to be desired, no grinding was executed with the flattening resin layer formed, and each of the first main surface and the second main surface was ground only once, and therefore, the nanotopography was inferior.

On the other hand, in each of Examples 1, 2, 3-1, and 3-2, a substrate wafer could be manufactured in which the Warp was 40 μm or more, which is to be desired, and the nanotopography was less than 5 nm, which was remarkably superior to Comparative Example.

Further, in each of Examples 4 and 5 also, a substrate wafer could be manufactured in which the warp was 40 μm or more, which is to be desired, and the nanotopography was less than 10 nm, which was remarkably superior to Comparative Example.

On the other hand, a substrate wafer obtained in each of Examples 1, 2, 3-1 and 3-2 in which the adjustment amount [μm] of wafer thickness in the first processing was not more than the adjustment amount β [μm] of wafer thickness in the second processing ensured a more excellent nanotopography than a substrate wafer obtained in each of Examples 4 and 5 in which the adjustment amount α [μm] of wafer thickness was larger than the adjustment amount β [μm] of wafer thickness. From comparisons of results of these Examples, it is found it preferable that the adjustment amount α[μm] of wafer thickness in the first processing is not more than the adjustment amount β [μm] of wafer thickness in the second processing.

Further, in Example 3-3, a substrate wafer could be manufactured in which the nanotopography was less than 5 nm, which was remarkably superior to Comparative Example. On the other hand, the substrate wafer obtained in Example 3-3 ensured a smaller Warp value than those of other Examples although it is within an allowable range.

By comparing results by Examples 3-1, 3-2 and 3-3 in which the adjustment amount α[μm] of wafer thickness in the first processing and the adjustment amount β[μm] of wafer thickness in the second processing are 20 μm, equal to each other, it is found that the smaller the variation in resin thickness, the larger the obtained value of Warp was. From comparison of these results, it is found that the smaller the variation in resin thickness, the more preferable it is, and preferably, it is 25% or less of a desired Warp value.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A manufacturing method for a substrate wafer, comprising:
   providing a wafer having a first main surface and a second main surface on an opposite side to the first main surface;
   forming a flattening resin layer on the second main surface of the wafer;
   adsorbing and holding the flattening resin layer as a reference surface, and, with this condition, grinding or polishing the first main surface of the wafer as a first processing;
   removing the flattening resin layer from the wafer;
   adsorbing and holding the first main surface of the wafer subjected to the first processing, and, with this condition, grinding or polishing the second main surface of the wafer as a second processing;

adsorbing and holding the second main surface subjected to the second processing of the wafer, and, with this condition, further grinding or polishing the first main surface of the wafer as a third processing;

adsorbing and holding the first main surface subjected to the third processing of the wafer, and, with this condition, further grinding or polishing the second main surface of the wafer as a fourth processing to obtain a substrate wafer, wherein the first processing and/or the third processing is executed such that the wafer has a central concave or central convex thickness distribution.

2. The manufacturing method for a substrate wafer according to claim 1,
wherein the first processing is executed such that a thickness distribution $\alpha$ [μm] of the wafer obtained by the first processing is 50% or less of a warp value w [μm] of the substrate wafer obtained by the fourth processing.

3. The manufacturing method for a substrate wafer according to claim 2,
wherein the flattening resin layer is formed such that a variation in thickness of the flattening resin layer is 25% or less of the warp value w [μm] of the substrate wafer.

4. The manufacturing method for a substrate wafer according to claim 2,
wherein the first processing to the fourth processing are executed such that the warp value w [μm] of the substrate wafer is 40 μm or more.

5. The manufacturing method for a substrate wafer according to claim 3,
wherein the first processing to the fourth processing are executed such that the warp value w [μm] of the substrate wafer is 40 μm or more.

6. The manufacturing method for a substrate wafer according to claim 1,
wherein the wafer is processed so as to have a central convex thickness distribution in the first processing and/or the third processing.

7. The manufacturing method for a substrate wafer according to claim 1,
wherein the wafer is processed so as to have a central concave thickness distribution in the first processing and/or the third processing.

8. The manufacturing method for a substrate wafer according to claim 1,
wherein resin which is a precursor of the flattening resin layer is applied to the second main surface of said wafer,
a load is applied to said resin, and
the resin applied with the load is cured to form the flattening resin layer.

9. The manufacturing method for a substrate wafer according to claim 2,
wherein resin which is a precursor of the flattening resin layer is applied to the second main surface of said wafer,
a load is applied to said resin, and
the resin applied with the load is cured to form the flattening resin layer.

10. The manufacturing method for a substrate wafer according to claim 3,
wherein resin which is a precursor of the flattening resin layer is applied to the second main surface of said wafer,
a load is applied to said resin, and
the resin applied with the load is cured to form the flattening resin layer.

11. The manufacturing method for a substrate wafer according to claim 4,
wherein resin which is a precursor of the flattening resin layer is applied to the second main surface of said wafer,
a load is applied to said resin, and
the resin applied with the load is cured to form the flattening resin layer.

12. The manufacturing method for a substrate wafer according to claim 5,
wherein resin which is a precursor of the flattening resin layer is applied to the second main surface of said wafer,
a load is applied to said resin, and
the resin applied with the load is cured to form the flattening resin layer.

13. The manufacturing method for a substrate wafer according to claim 6,
wherein resin which is a precursor of the flattening resin layer is applied to the second main surface of said wafer,
a load is applied to said resin, and
the resin applied with the load is cured to form the flattening resin layer.

14. The manufacturing method for a substrate wafer according to claim 7,
wherein resin which is a precursor of the flattening resin layer is applied to the second main surface of said wafer,
a load is applied to said resin, and
the resin applied with the load is cured to form the flattening resin layer.

15. The manufacturing method for a substrate wafer according to claim 1,
wherein in the second processing and the fourth processing, grinding or polishing is executed so that the wafer thickness is flat.

* * * * *